United States Patent
Chien

[19]

[11] Patent Number: 6,166,907
[45] Date of Patent: Dec. 26, 2000

[54] CPU COOLING SYSTEM

[76] Inventor: Chuan-Fu Chien, 15/F-4., No. 3, Liyuan 1st St., Linkou Hsaing, Taipei County, Taiwan

[21] Appl. No.: 09/449,743

[22] Filed: Nov. 26, 1999

[51] Int. Cl.$^7$ ...................................................... H05K 7/20
[52] U.S. Cl. .......................... 361/699; 361/687; 361/689; 361/695; 361/697; 361/715; 174/15.1; 174/16.1; 165/80.4; 165/104.33; 62/259.2
[58] Field of Search .................................... 361/687, 689, 361/695–697, 698–699, 701–707, 715; 174/15.1, 16.1; 165/173, 104.21, 80.2, 80.3, 104.33, 172, 80.4; 257/707–726; 62/259.2, 3.2, 3.3, 3.6, 259.1, 428

[56] References Cited

U.S. PATENT DOCUMENTS

| | | | |
|---|---|---|---|
| 5,086,829 | 2/1992 | Asakawa ..................................... | 165/12 |
| 5,144,531 | 9/1992 | Go et al. .................................... | 361/382 |
| 5,323,847 | 6/1994 | Koizumi et al ..................... | 165/104.33 |
| 5,729,995 | 3/1998 | Tajima ..................................... | 62/259.2 |
| 5,731,954 | 3/1998 | Cheon ..................................... | 361/699 |

*Primary Examiner*—Gerald Tolin
*Assistant Examiner*—Michael Datskovsky
*Attorney, Agent, or Firm*—Rosenberg, Klein & Lee

[57] ABSTRACT

A CPU cooling system for dissipating heat from a CPU in a computer which includes a water cooling type CPU heat dissipating unit fastened to the CPU of the computer for carrying heat away from the CPU, the water cooling type CPU heat dissipating unit defining a water circulation channel, a rack installed in the computer, a water and air cooling type heat dissipating unit mounted in the rack, the water and air cooling type heat dissipating unit including a water tank holding a liquid coolant, a heat sink mounted in the water tank, at least one first radiator each defining a water circulation channel, at least one cold discharge device each having a cold side disposed in contact with the at least one first radiator and a hot side disposed in contact with the heat sink, at least one fan disposed behind front air vents on the rack, and a second radiator disposed between the at least one fan and the at least one first radiator, the second radiator having evaporator coils a water-circulation pipe assembly for circulation of the liquid coolant through the water tank, the water circulation channel of each first radiator, the evaporator coils of the second radiator, and the water circulation channel of the water cooling type CPU heat dissipating unit, and pump means controlled to pump the liquid coolant through the water-circulation pipe assembly.

13 Claims, 9 Drawing Sheets

CPU COOLING SYSTEM

BACKGROUND OF THE INVENTION

The present invention relates to a CPU cooling system for use in a computer to dissipate heat from the CPU of the computer, and more particularly to such a CPU cooling system which comprises a water tank holding a liquid coolant, radiators, a water circulation pipe assembly for circulation of the liquid coolant through the radiators, and pump means controlled to pump the liquid coolant through the water circulation pipe assembly.

The CPU of a computer is the operation center of the computer. During the operation of the computer, the CPU produces heat. Heat must be quickly carried away from the CPU during the operation of the computer. Excessively high temperature causes the CPU unable to work normally. Various cooling means have been developed for dissipating heat from the CPU of a computer. FIG. 11 shows a CPU cooling arrangement according to the prior art. This structure of CPU cooling arrangement comprises a heat sink 9 mounted on the CPU 3, the heat sink 9 having a plurality of bottom mounting legs 92 inserted through respective through holes 31 on the CPU 3, a spring retainer 93 fastened to the bottom mounting legs 92 of the heat sink 9 to secure the heat sink 9 and the CPU 3 together, and a fan 91 mounted on the heat sink 9. This structure of CPU cooling arrangement achieves low performance. Because the heat sink 9 and the fan 91 are mounted on the CPU 3 deep inside the computer, hot air cannot be efficiently carried out of the computer.

SUMMARY OF THE INVENTION

The present invention provides a high performance CPU cooling system, which effectively carries heat away from the CPU and the inside space of the computer. According to one embodiment of the present invention, the CPU A CPU cooling system comprises a water cooling type CPU heat dissipating unit, the water cooling type CPU heat dissipating unit comprising a water-cooling radiator fastened to the CPU of the computer by fastener means for enabling heat to be carried away from the CPU, the water-cooling radiator of the water cooling type CPU heat dissipating unit comprising a water circulation channel having two distal ends, two connectors respectively mounted on the two distal ends of the water circulation channel; a rack installed in the computer, the rack comprising a plurality of air vents at a front side thereof, and an electric socket at a back side thereof connected to power supply of the computer; a water and air cooling type heat dissipating unit mounted in said rack, said water and air cooling type heat dissipating unit comprising a water tank holding a liquid coolant, a heat sink mounted on the water tank, the heat sink having a plurality of radiating fins dipped in the liquid coolant, at least one first radiator, the at least one first radiator each being a water cooling type radiator defining a water circulation channel, at least one cold discharge device respectively connected to the electric socket to receive power supply from the computer, the at least one cold discharge device each having a cold side disposed in contact with the at least one first radiator and a hot side disposed in contact with the heat sink, at least one fan disposed behind the air vents on the rack, and a second radiator disposed between the at least one fan and the at least one first radiator, the second radiator comprised of a plurality of evaporator coils connected in series by bents, and a plurality of flat metal radiation fins respectively mounted around the evaporator coils; a water-circulation pipe assembly for circulation of the liquid coolant through the water tank, the water circulation channel of each of the at least one first radiator, the evaporator coils of the second radiator, and the water circulation channel of the water-cooling radiator of the water cooling type CPU heat dissipating unit; and pump means installed in the rack and controlled to pump the liquid coolant through the water-circulation pipe assembly. The second radiator may be variously embodiment. In one alternate form, the second radiator is comprised of a plurality of evaporator coils connected in series by bents, and a plurality of spiral metal radiation fins respectively mounted around the evaporator coils. In another alternate form, the second radiator is comprised of a coiled flat circulation tube, and a plurality of corrugated metal radiation sheets mounted in gaps between parallel sections of said coiled flat circulation tubes.

DETAILED DESCRIPTION OF THE PREFERRED EMBODIMENT

Figure 1:
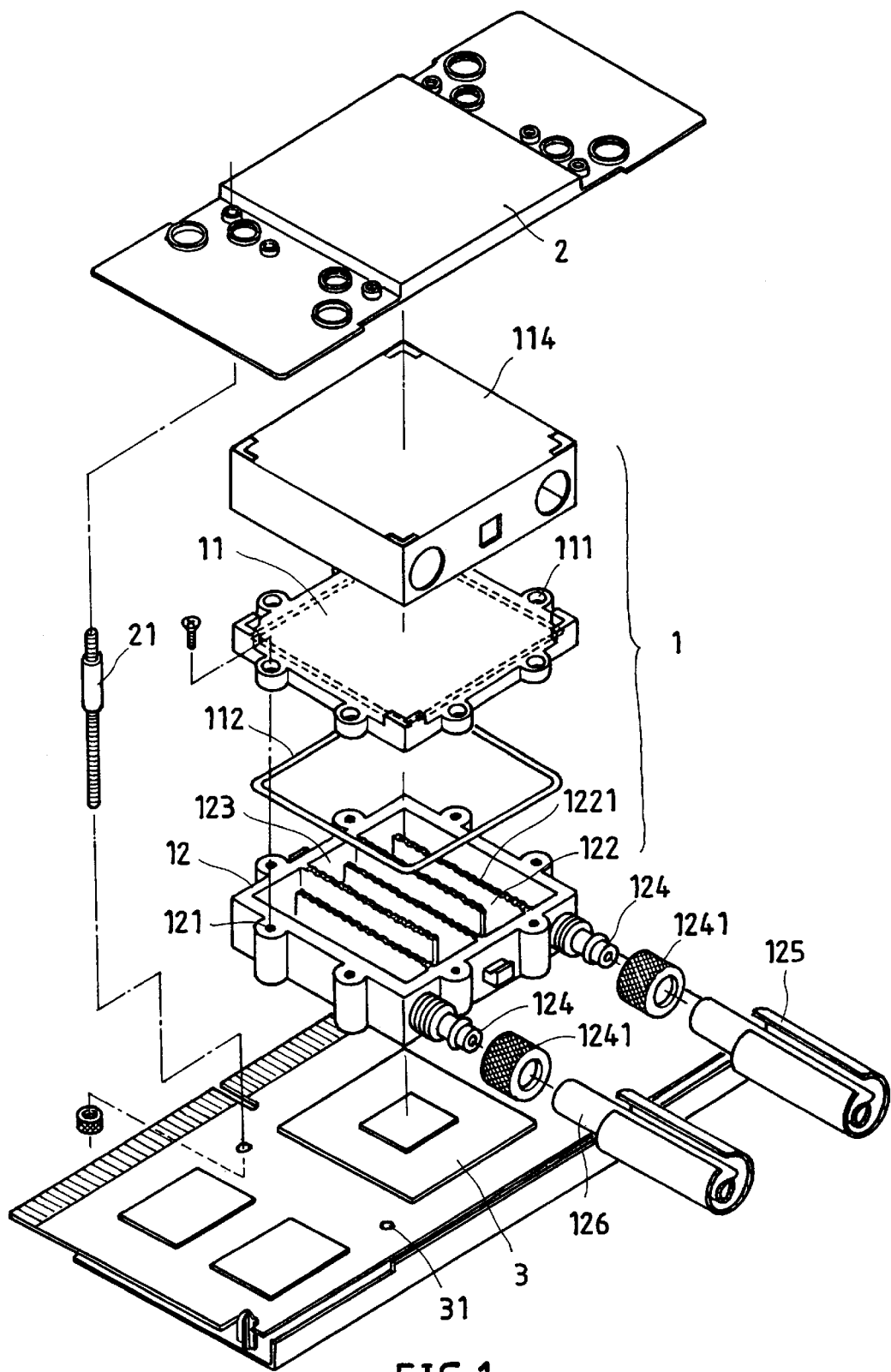
FIG. 1 is an exploded view of a water-cooling radiator according to the present invention.

Referring to FIGS. from 1 through 4, a CPU cooling system in accordance with the present invention is comprised of a plurality of water-cooling radiators 1 connected in series by circulation pipes 126, a water tank 4 having a plurality of heat-exchanging metal plates 411, a second radiator 6, which is comprised of a plurality of metal radiation fins 61 arranged in parallel and evaporator coils 611 fastened to the metal radiation fins 61, a plurality of cold discharge devices 5, and a plurality of fans 62. A liquid coolant 127 is pumped is pumped by a pump 414 through the CPU cooling system to make a heat exchanging circulation, and to effectively reduce the working temperature of a CPU 3.

Figure 2:
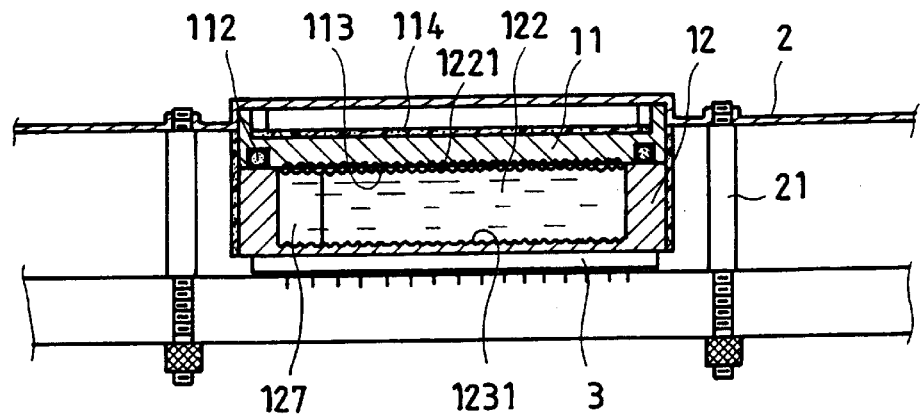
FIG. 2 is a sectional assembly view of FIG. 1.

Referring to FIGS. 1 and 2 again, the water-cooling radiator 1 is comprised of a casing 12, a top cover 11 covered on the casing 12, a packing rubber 112 peripherally sealed between the casing 12 and the top cover 11, and an electrically insulative plastic covering 114 covered on the top cover 11 and the casing 12. The casing 12 comprises a plurality of mounting holes 121 spaced around the border thereof, a plurality of partition boards 122 arranged on the inside and defining a water circulation channel 123, and two connectors 124 respectively extended from two opposite distal ends of the water circulation channel 123. The top cover 11 comprises a plurality of mounting holes 111 respectively fastened to the peripheral mounting holes 121 at the casing 12 by screws. The circulation pipes 126 are covered with insulative sleeves 125, and respectively connected to the connectors 124 by lock nuts 1241 for guiding the liquid coolant 127 in and out of the water-cooling radiators 1. A holding down frame 2 is fastened to respective mounting holes 31 on a CPU 3 by screw members 21 to hold down the water-cooling radiator 1 on the CPU 3. Corrugated portions 113, 1221, 1231 are respectively formed on the inside wall of the casing 12, the partition boards 122 and the bottom wall of the top cover 11. When the liquid coolant 127 passes through the circulation channel 123, it is forced to produce water waves to achieve a high heat-exchange performance.

Figure 6:
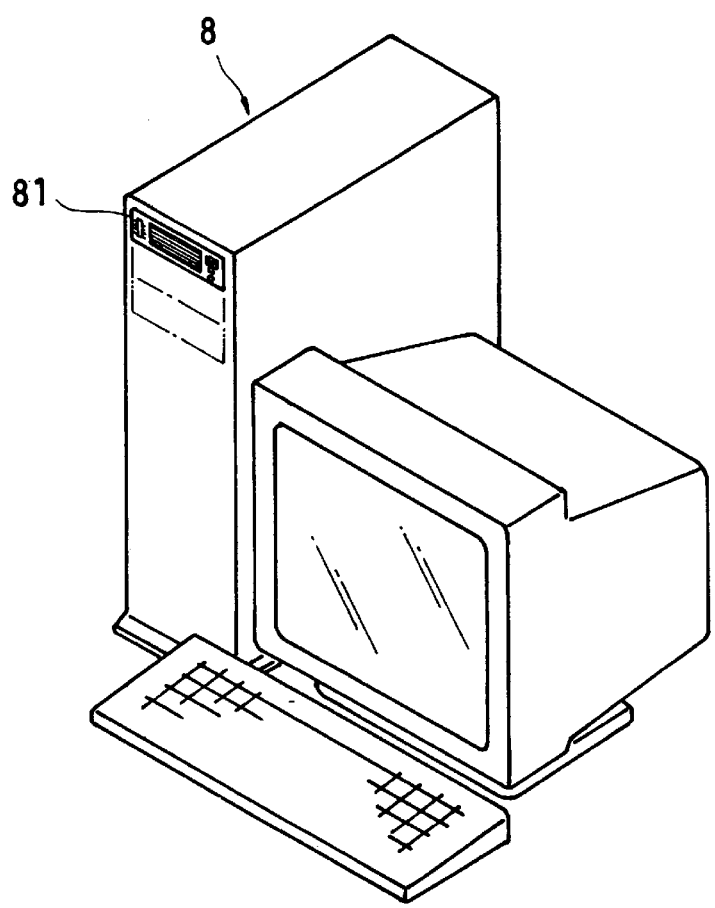
FIG. 6 shows the CPU cooling system installed in a computer according to the present invention.
Figure 3:
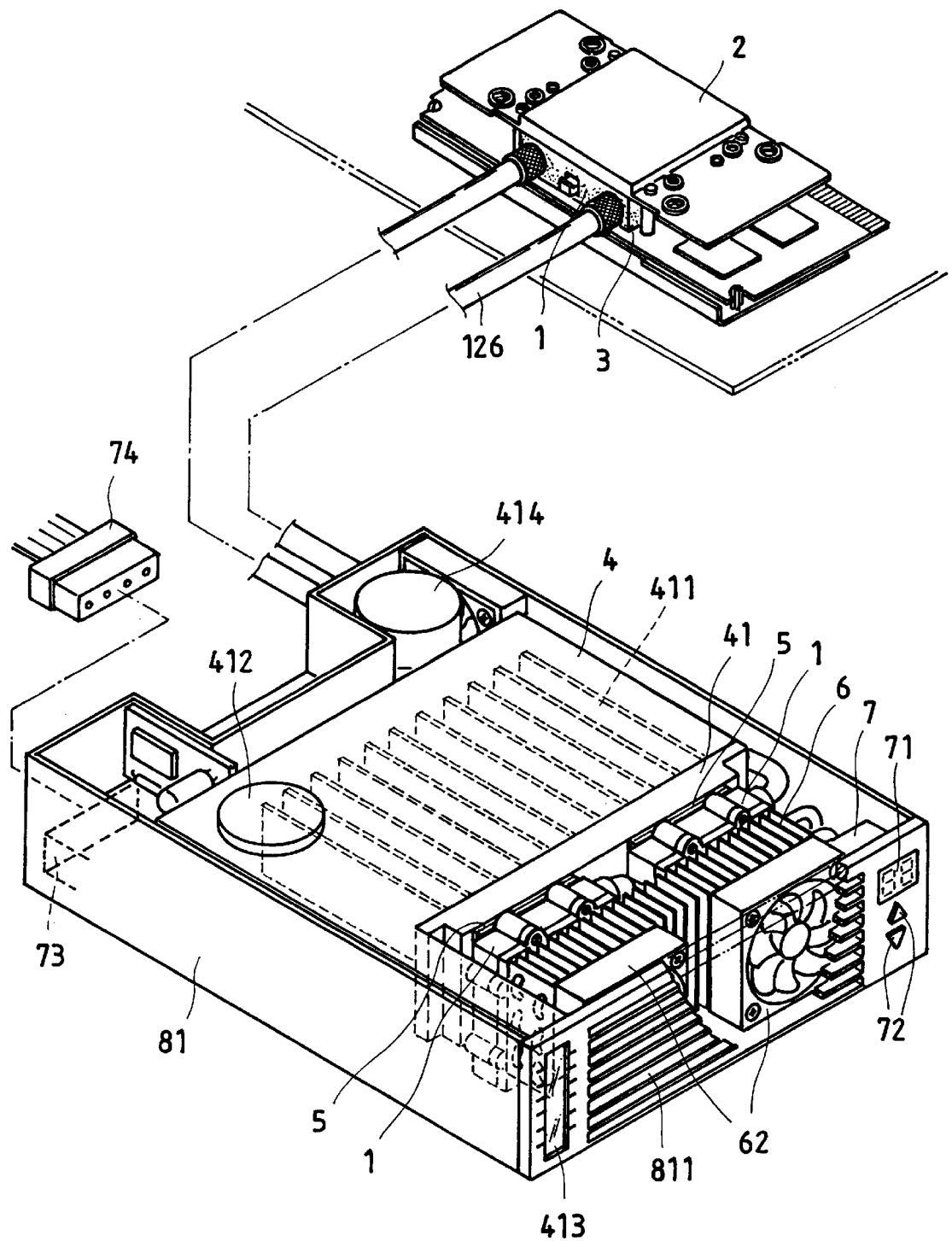
FIG. 3 is a perspective view of a CPU cooling system according to one embodiment of the present invention.
Figure 4:
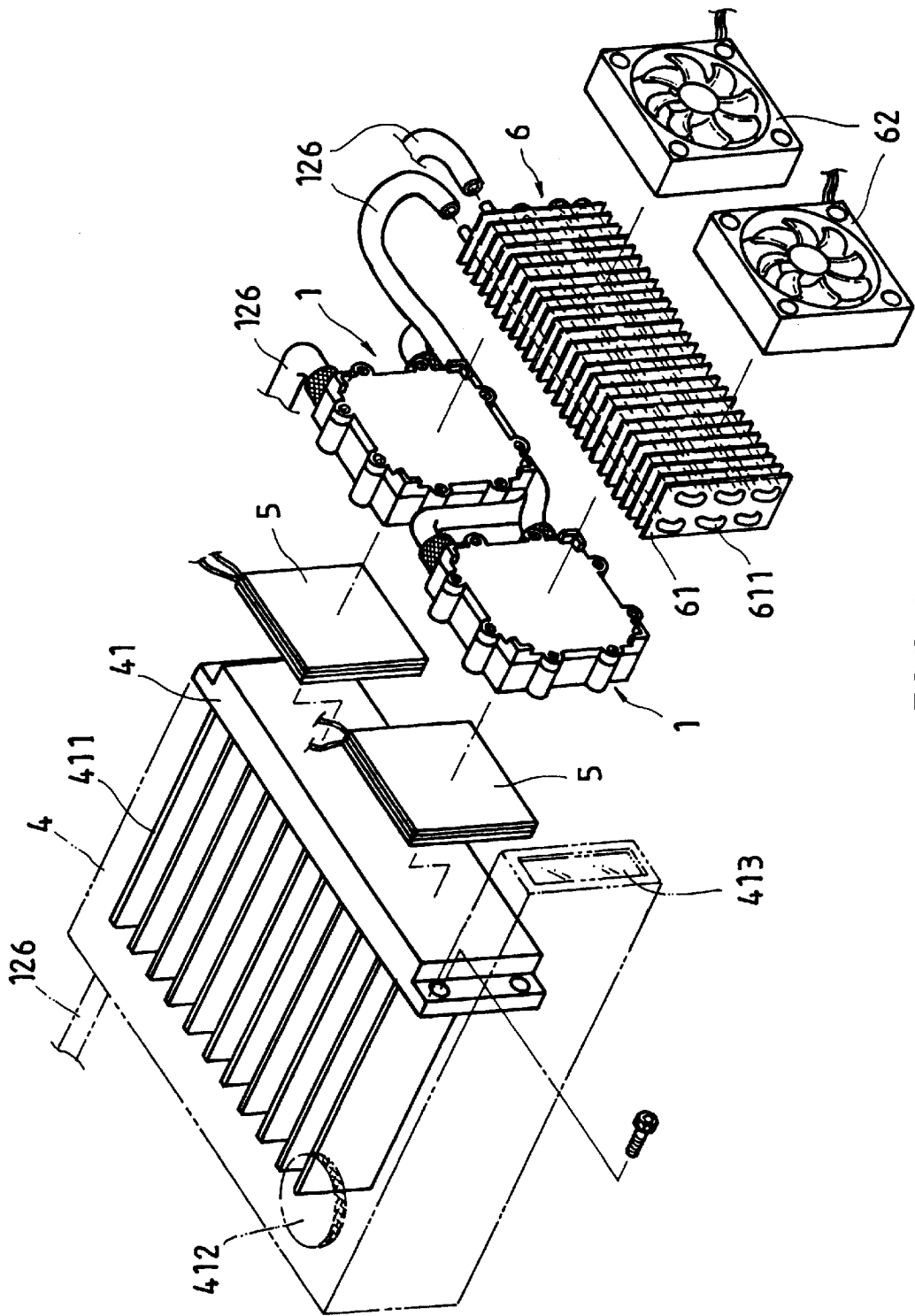
FIG. 4 is an exploded view of FIG. 3.

Referring to FIG. 6 and FIGS. 3 and 4 again, the water tank 4 is mounted with a heat sink 41. The heat sink 41 comprises a plurality of radiation fins 411 extended in the water tank 4. When the pump 414 pumps the liquid coolant 127 through the water tank 4, heat is quickly dissipated through the radiation fins 411 of the heat sink 41 into the air. After passing through the water tank 4, the liquid coolant 127 is guided by the circulation pips 126 through the water-cooling radiators 1 and then the second radiator 6. When circulating through the evaporator coils 611 of the second radiator 6, heat is carried away from the liquid coolant 127 through the radiation fins 61 into the air, and at the same time the fans 62 are operated to causes currents of air for carrying heat away from the second radiator 6. After secondary cooling process through the second radiator 6, the liquid coolant 127 is guided back by the circulation pipes 126 to circulate through the water-cooling radiators 1 and the water tank 4 again and again. Further, the cold discharge devices 5 are retained between the water-cooling radiators 1 and the heat sink 41. The cold discharge devices 5 each have a cold side disposed in contact with one water-cooling radiator 1, and a hot side disposed in contact with the heat sink 41. When in use, the CPU cooling system is mounted in a rack 81 installed in the mainframe of a computer 8. The rack 81 comprises air vents 811 at the front side thereof for output of air, and an electric socket 73 connected to an electric plug 74 to receive power supply from the computer 8. A temperature detector circuit assembly 7 is installed in the rack 81. The temperature detector circuit assembly 7 comprises a temperature display 71, and control buttons 72 for setting the temperature. When the temperature of the liquid coolant 127 surpasses a predetermined upper limit level, the temperature detector circuit assembly 7 immediately cuts off power supply from the pump 414. On the contrary, when the temperature of the liquid coolant 127 drops below a predetermined lower limit level, the temperature detector circuit assembly 7 immediately turns on the pump 414. Further, a rotary cap 412 and a water level indicator 413 are provided at the water tank 4. The water level indicator 413 indicates the level of the liquid coolant 127 in the water tank 4. The rotary cap 412 closes a coolant filling hole (not shown) on the water tank 4. When the rotary cap 412 is opened, fresh liquid coolant is filled into the water tank 4.

Figure 10:
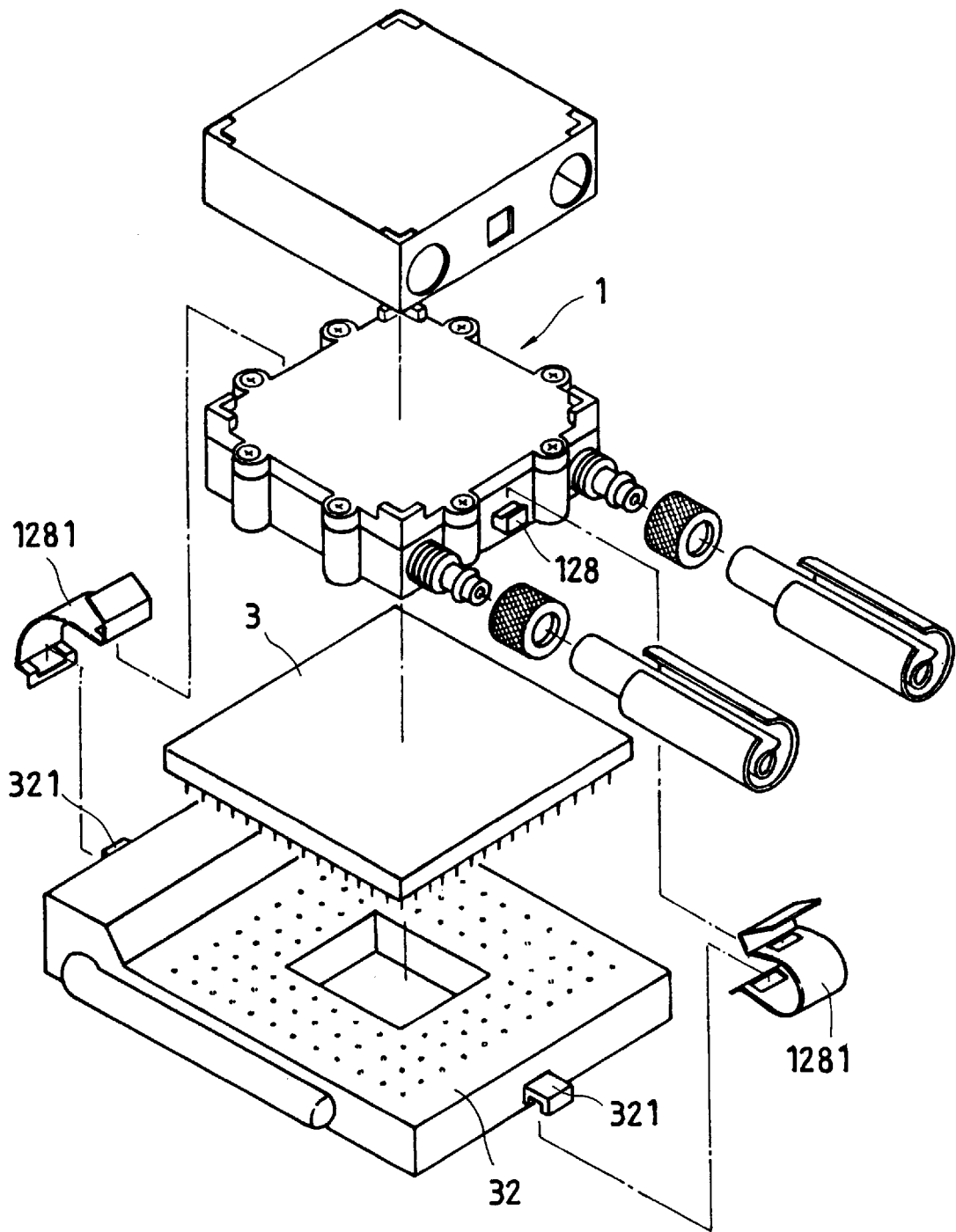
FIG. 10 shows another water-cooling radiator installation example according to the present invention.
Figure 11:
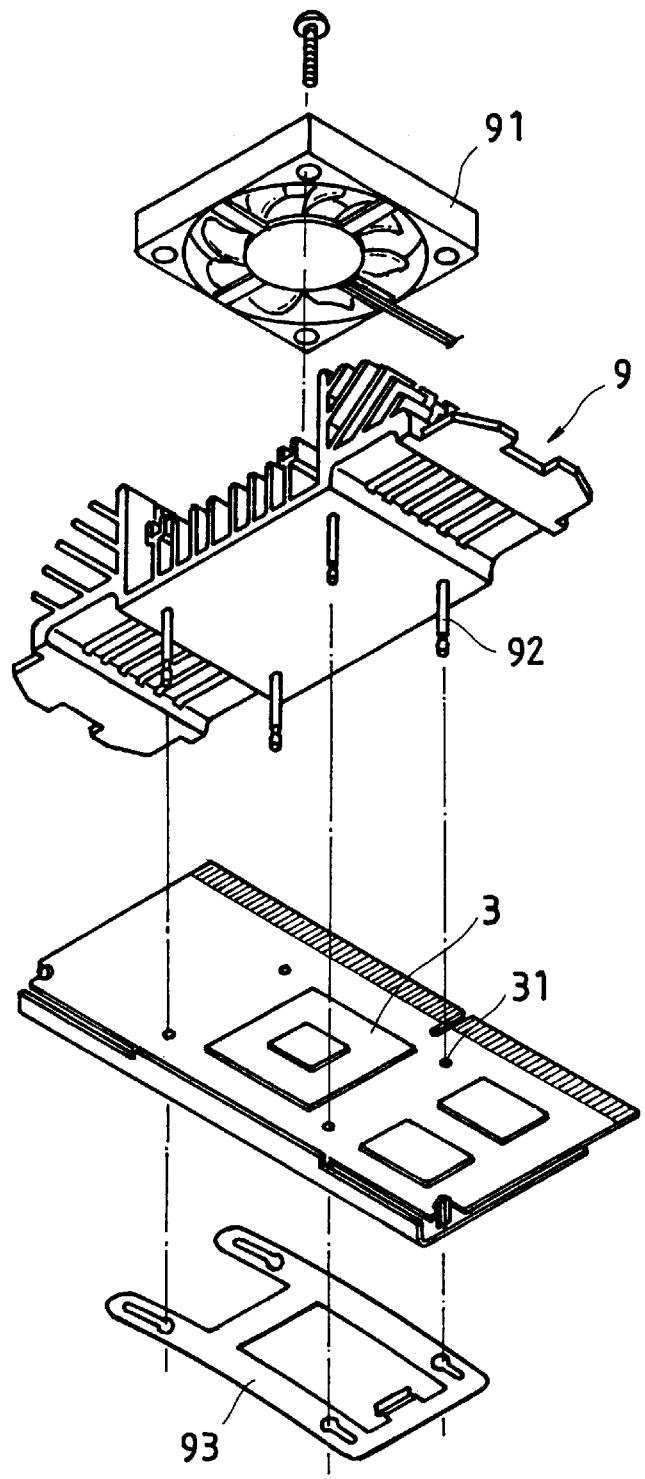
FIG. 11 is an exploded view of a CPU cooling arrangement according to the prior art.

Referring to FIG. 10, spring clamps 1281 are installed and hooked on respective hooks 321 at a CPU holder 32 and respective hooks 128 at the water-cooling radiator 1 to secure the water-cooling radiator 1 and the C{U holder 32 together, keeping the CPU 3 to be firmly retained between the water-cooling radiator 1 and the CPU holder 32.

Figure 5:
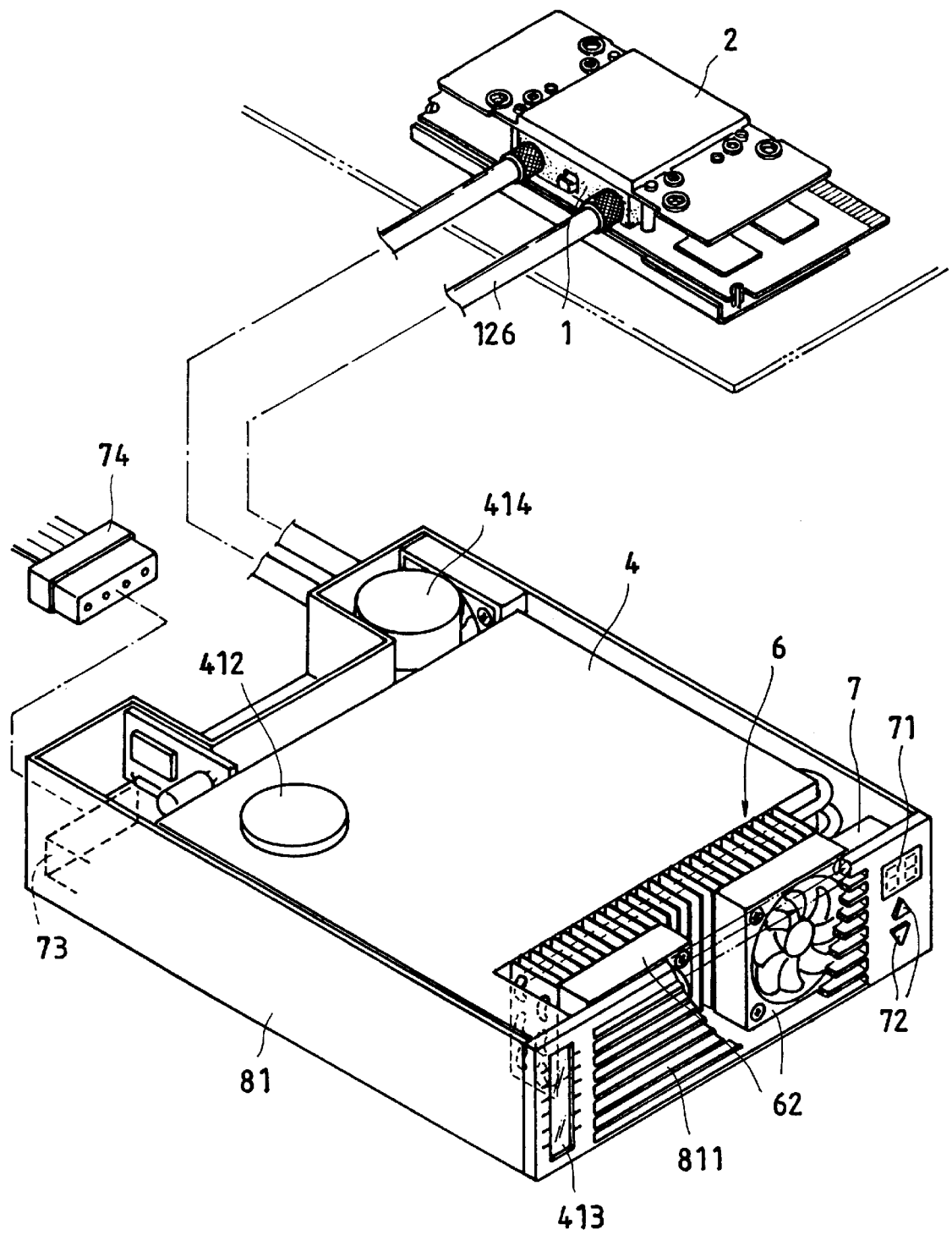
FIG. 5 shows an alternate form of the CPU cooling system according to the present invention.

FIG. 5 shows an alternate form of the present invention. According to this alternate form, the cold discharge devices 5 are eliminated from the CPU cooling system.

Figure 7:
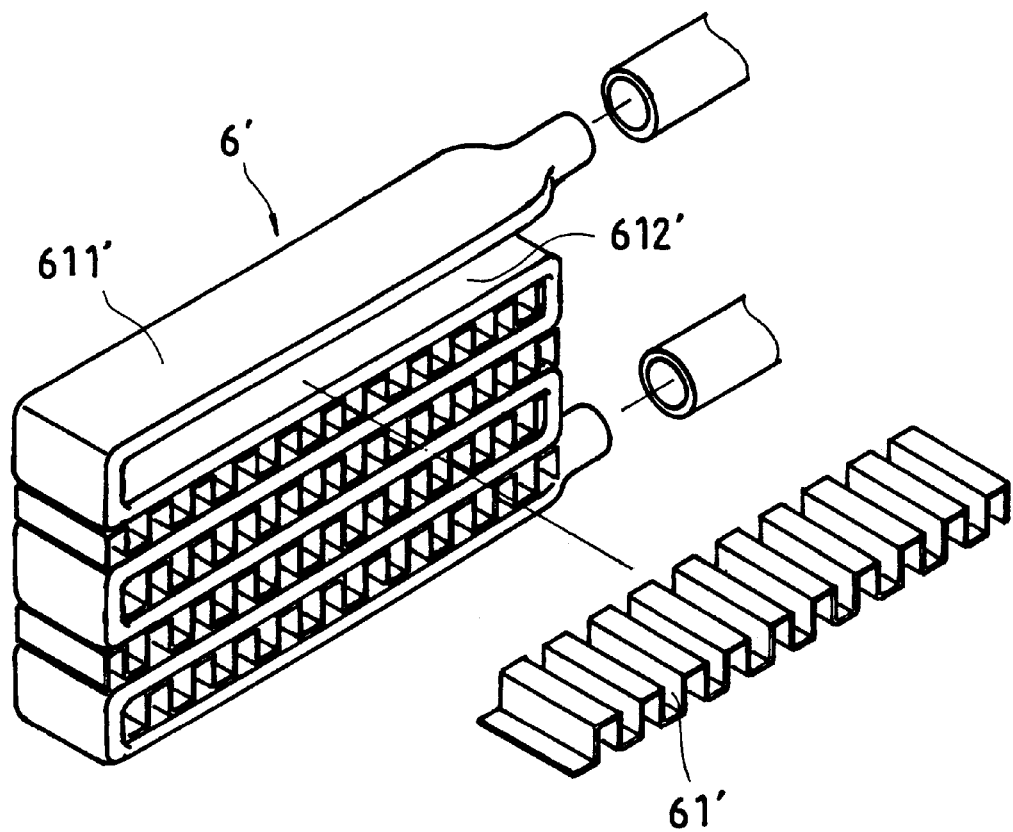
FIG. 7 is an exploded view showing an alternate form of the second radiator according to the present invention.

FIG. 7 shows an alternate form of the second radiator according to the present invention. According to this embodiment, the second radiator 6' is comprised of a coiled flat circulation tube 611', and a plurality of corrugated metal radiation sheets 61' mounted in gaps 612' between parallel sections of the coiled flat circulation tubes 611'.

Figure 8:
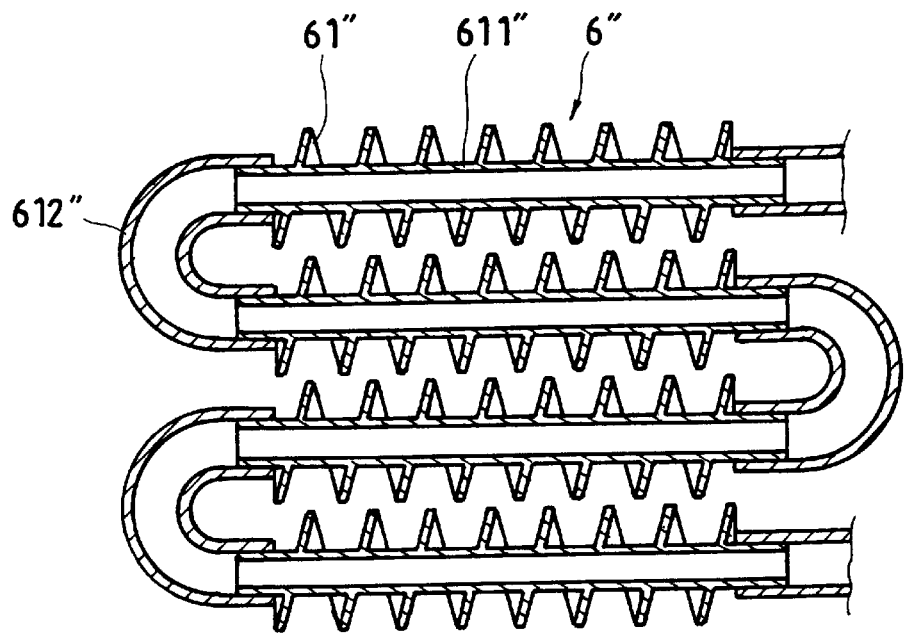
FIG. 8 is a sectional view of another alternate form of the second radiator according to the present invention.

FIG. 8 shows another alternate form of the second radiator. According to this alternate form, the second radiator 6" is comprised of a plurality of evaporator coils 611" connected in series by bents 612", and a plurality of spiral metal radiation fins 61" respectively mounted around the evaporator coils 611".

Figure 9:
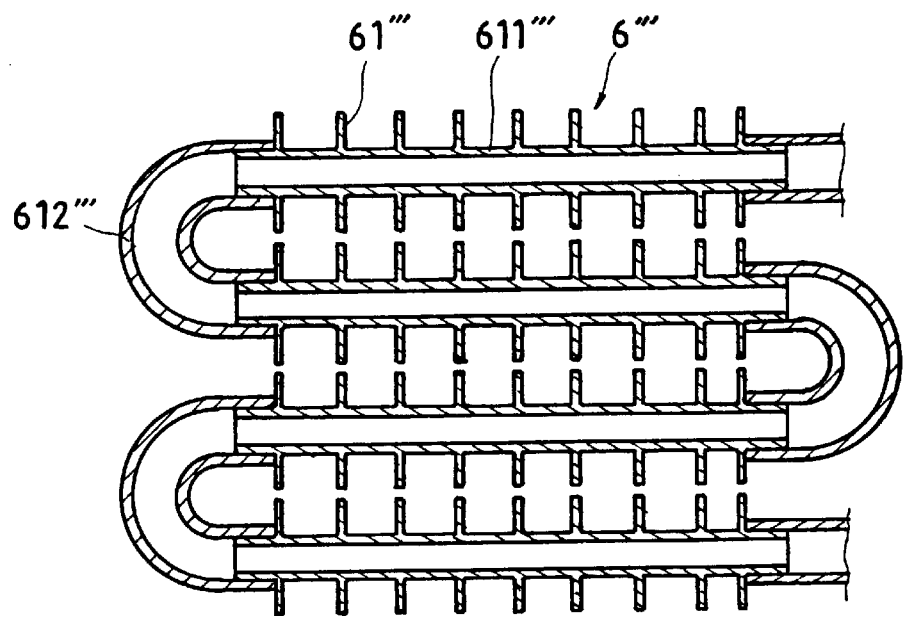
FIG. 9 is a sectional view of still another alternate form of the second radiator according to the present invention.

FIG. 9 shows still another alternate form of the second radiator. According to this alternate form, the second radiator 6'" is comprised of a plurality of evaporator coils 611'" connected in series by bents 612'", and a plurality of flat metal radiation fins 61'" respectively mounted around the evaporator coils 611'".

It is to be understood that the drawings are designed for purposes of illustration only, and are not intended for use as a definition of the limits and scope of the invention disclosed.

What the invention claimed is:

1. A CPU cooling system for dissipating heat from a CPU in a computer, comprising:

a water cooling type CPU heat dissipating unit, said water cooling type CPU heat dissipating unit comprising a water-cooling radiator fastened to the CPU of the computer by fastener means for enabling heat to be carried away from the CPU, the water-cooling radiator of said water cooling type CPU heat dissipating unit comprising a water circulation channel having two distal ends, two connectors respectively mounted on the two distal ends of said water circulation channel;

a rack installed in the computer, said rack comprising a plurality of air vents at a front side thereof, and an electric socket at a back side thereof connected to power supply of the computer;

a water and air cooling type heat dissipating unit mounted in said rack, said water and air cooling type heat dissipating unit comprising a water tank holding a liquid coolant, a heat sink mounted on said water tank, said heat sink having a plurality of radiating fins dipped in said liquid coolant, at least one first radiator disposed in contact with said heat sink, said at least one first radiator each being a water cooling type radiator defining a water circulation channel, at least one fan disposed behind the air vents on said rack, and a second radiator disposed between said at least one fan and said at least one first radiator, said second radiator comprised of a plurality of radiation fins and evaporator coils fastened to the radiation fins;

a water-circulation pipe assembly for circulation of said liquid coolant through said water tank, the water circulation channel of each of said at least one first radiator, the evaporator coils of said second radiator, and the water circulation channel of the water-cooling radiator of said water cooling type CPU heat dissipating unit; and pump means installed in said rack and controlled to pump said liquid coolant through said water-circulation pipe assembly.

2. A CPU cooling system for dissipating heat from a CPU in a computer, comprising:

a water cooling type CPU heat dissipating unit, said water cooling type CPU heat dissipating unit comprising a water-cooling radiator fastened to the CPU of the computer by fastener means for enabling heat to be carried away from the CPU, the water-cooling radiator of said water cooling type CPU heat dissipating unit comprising a water circulation channel having two distal ends, two connectors respectively mounted on the two distal ends of said water circulation channel;

a rack installed in the computer, said rack comprising a plurality of air vents at a front side thereof, and an electric socket at a back side thereof connected to power supply of the computer;

a water and air cooling type heat dissipating unit mounted in said rack, said water and air cooling type heat dissipating unit comprising a water tank holding a liquid coolant, a heat sink mounted on said water tank, said heat sink having a plurality of radiating fins dipped in said liquid coolant, at least one first radiator disposed in contact with said heat sink, said at least one first radiator each being a water cooling type radiator defining a water circulation channel, and a second radiator connected to said at least one first radiator, said second radiator comprised of a plurality of radiation fins and evaporator coils fastened to the radiation fins;

a water-circulation pipe assembly for circulation of said liquid coolant through said water tank, the water circulation channel of each of said at least one first radiator, the evaporator coils of said second radiator, and the water circulation channel of the water-cooling radiator of said water cooling type CPU heat dissipating unit; and pump means installed in said rack and controlled to pump said liquid coolant through said water-circulation pipe assembly.

3. A CPU cooling system for dissipating heat from a CPU in a computer, comprising:

a water cooling type CPU heat dissipating unit, said water cooling type CPU heat dissipating unit comprising a water-cooling radiator fastened to the CPU of the computer by fastener means for enabling heat to be carried away from the CPU, the water-cooling radiator of said water cooling type CPU heat dissipating unit comprising a water circulation channel having two distal ends, two connectors respectively mounted on the two distal ends of said water circulation channel;

a rack installed in the computer, said rack comprising a plurality of air vents at a front side thereof, and an electric socket at a back side thereof connected to power supply of the computer;

a water and air cooling type heat dissipating unit mounted in said rack, said water and air cooling type heat dissipating unit comprising a water tank holding a liquid coolant, a heat sink mounted on said water tank, said heat sink having a plurality of radiating fins dipped in said liquid coolant, and a radiator disposed formed of a plurality of radiation fins and evaporator coils fastened to the radiation fins;

a water-circulation pipe assembly for circulation of said liquid coolant through said water tank, said evaporator coils, and the water circulation channel of the water-cooling radiator of said water cooling type CPU heat dissipating unit; and pump means installed in said rack and controlled to pump said liquid coolant through said water-circulation pipe assembly.

4. A CPU cooling system for dissipating heat from a CPU in a computer, comprising:

a water cooling type CPU heat dissipating unit, said water cooling type CPU heat dissipating unit comprising a water-cooling radiator fastened to the CPU of the computer by fastener means for enabling heat to be carried away from the CPU, the water-cooling radiator of said water cooling type CPU heat dissipating unit comprising a water circulation channel having two distal ends, two connectors respectively mounted on the two distal ends of said water circulation channel;

a rack installed in the computer, said rack comprising a plurality of air vents at a front side thereof, and an electric socket at a back side thereof connected to power supply of the computer;

a water and air cooling type heat dissipating unit mounted in said rack, said water and air cooling type heat dissipating unit comprising a water tank holding a liquid coolant, a heat sink mounted on said water tank, said heat sink having a plurality of radiating fins dipped in said liquid coolant, at least one first radiator, said at least one first radiator each being a water cooling type radiator defining a water circulation channel, at least one cold discharge device respectively connected to said electric socket to receive power supply from the computer, said at least one cold discharge device each having a cold side disposed in contact with said at least one first radiator and a hot side disposed in contact with said heat sink, at least one fan disposed behind the air vents on said rack, and a second radiator disposed between said at least one fan and said at least one first radiator, said second radiator comprised of a plurality of radiation fins and evaporator coils fastened to the radiation fins;

a water-circulation pipe assembly for circulation of said liquid coolant through said water tank, the water circulation channel of each of said at least one first radiator, the evaporator coils of said second radiator, and the water circulation channel of the water-cooling radiator of said water cooling type CPU heat dissipating unit; and pump means installed in said rack and controlled to pump said liquid coolant through said water-circulation pipe assembly.

5. The CPU cooling system of claim 4 wherein the water-cooling radiator of said water cooling type CPU heat dissipating unit and said at least one first radiator each are comprised of a casing, a plurality of partition boards mounted in said casing and defining a water circulation channel, a top cover covered on said casing, a packing rubber peripherally sealed between said casing and said top cover, and an electrically insulative plastic covering covered on said top cover and said casing.

6. The CPU cooling system of claim 4, wherein the water circulation channel in said casing has a corrugated bottom wall for causing said liquid coolant to produce waves.

7. The CPU cooling system of claim 4, wherein said partition boards each have corrugated portions for causing said liquid coolant to produce waves.

8. The CPU cooling system of claim 4, wherein said top cover has a corrugated bottom wall covered over the water circulation channel in said casing for causing said liquid coolant to produce waves.

9. The CPU cooling system of claim 4 wherein said water tank comprises a liquid coolant filling hole, and a rotary cap closed on said liquid coolant filling hole.

10. The CPU cooling system of claim 4 wherein said water tank comprises a liquid level indicator, which indicates the level of said liquid coolant in said water tank.

11. A CPU cooling system for dissipating heat from a CPU in a computer, comprising:

a water cooling type CPU heat dissipating unit, said water cooling type CPU heat dissipating unit comprising a water-cooling radiator fastened to the CPU of the computer by fastener means for enabling heat to be carried away from the CPU, the water-cooling radiator of said water cooling type CPU heat dissipating unit comprising a water circulation channel having two distal ends, two connectors respectively mounted on the two distal ends of said water circulation channel;

a rack installed in the computer, said rack comprising a plurality of air vents at a front side thereof, and an electric socket at a back side thereof connected to power supply of the computer; a water and air cooling type heat dissipating unit mounted in said rack, said water and air cooling type heat dissipating unit comprising a water tank holding a liquid coolant, a heat sink mounted on said water tank, said heat sink having a plurality of radiating fins dipped in said liquid coolant, at least one first radiator, said at least one first radiator each being a water cooling type radiator defining a water circulation channel, at least one cold discharge device respectively connected to said electric socket to receive power supply from the computer, said at least one cold discharge device each having a cold side disposed in contact with said at least one first radiator and a hot side disposed in contact with said heat sink, at least one fan disposed behind the air vents on said rack, and a second radiator disposed between said at least one fan and said at least one first radiator, said second radiator comprised of a coiled flat circulation tube, and a plurality of corrugated metal radiation sheets mounted in gaps between parallel sections of said coiled flat circulation tubes;

a water-circulation pipe assembly for circulation of said liquid coolant through said water tank, the water circulation channel of each of said at least one first radiator, the evaporator coils of said second radiator, and the water circulation channel of the water-cooling radiator of said water cooling type CPU heat dissipating unit; and pump means installed in said rack and controlled to pump said liquid coolant through said water-circulation pipe assembly.

12. A CPU cooling system for dissipating heat from a CPU in a computer, comprising:

a water cooling type CPU heat dissipating unit, said water cooling type CPU heat dissipating unit comprising a water-cooling radiator fastened to the CPU of the computer by fastener means for enabling heat to be carried away from the CPU, the water-cooling radiator of said water cooling type CPU heat dissipating unit comprising a water circulation channel having two distal ends, two connectors respectively mounted on the two distal ends of said water circulation channel;

a rack installed in the computer, said rack comprising a plurality of air vents at a front side thereof, and an electric socket at a back side thereof connected to power supply of the computer; a water and air cooling type heat dissipating unit mounted in said rack, said water and air cooling type heat dissipating unit comprising a water tank holding a liquid coolant, a heat sink mounted on said water tank, said heat sink having a plurality of radiating fins dipped in said liquid coolant, at least one first radiator, said at least one first radiator each being a water cooling type radiator defining a water circulation channel, at least one cold discharge device respectively connected to said electric socket to receive power supply from the computer, said at least one cold discharge device each having a cold side disposed in contact with said at least one first radiator and a hot side disposed in contact with said heat sink, at least one fan disposed behind the air vents on said rack, and a second radiator disposed between said at least one fan and said at least one first radiator, said second radiator comprised of a plurality of evaporator coils connected in series by bents and a plurality of spiral metal radiation fins respectively mounted around the evaporator coils;

a water-circulation pipe assembly for circulation of said liquid coolant through said water tank, the water circulation channel of each of said at least one first radiator, the evaporator coils of said second radiator, and the water circulation channel of the water-cooling radiator of said water cooling type CPU heat dissipating unit; and pump means installed in said rack and controlled to pump said liquid coolant through said water-circulation pipe assembly.

13. A CPU cooling system for dissipating heat from a CPU in a computer, comprising:

a water cooling type CPU heat dissipating unit, said water cooling type CPU heat dissipating unit comprising a water-cooling radiator fastened to the CPU of the computer by fastener means for enabling heat to be carried away from the CPU, the water-cooling radiator of said water cooling type CPU heat dissipating unit comprising a water circulation channel having two distal ends, two connectors respectively mounted on the two distal ends of said water circulation channel;

a rack installed in the computer, said rack comprising a plurality of air vents at a front side thereof, and an electric socket at a back side thereof connected to power supply of the computer; a water and air cooling type heat dissipating unit mounted in said rack, said water and air cooling type heat dissipating unit comprising a water tank holding a liquid coolant, a heat sink mounted on said water tank, said heat sink having a plurality of radiating fins dipped in said liquid coolant, at least one first radiator, said at least one first radiator each being a water cooling type radiator defining a water circulation channel, at least one cold discharge device respectively connected to said electric socket to receive power supply from the computer, said at least one cold discharge device each having a cold side disposed in contact with said at least one first radiator and a hot side disposed in contact with said heat sink, at least one fan disposed behind the air vents on said rack, and a second radiator disposed between said at least one fan and said at least one first radiator, said second radiator comprised of a plurality of evaporator coils connected in series by bents, and a plurality of flat metal radiation fins respectively mounted around the evaporator coils;

a water-circulation pipe assembly for circulation of said liquid coolant through said water tank, the water circulation channel of each of said at least one first radiator, the evaporator coils of said second radiator, and the water circulation channel of the water-cooling radiator of said water cooling type CPU heat dissipating unit; and pump means installed in said rack and controlled to pump said liquid coolant through said water-circulation pipe assembly.

\* \* \* \* \*